United States Patent
Han et al.

(10) Patent No.: US 10,008,456 B1
(45) Date of Patent: Jun. 26, 2018

(54) LAMINATED SPACERS FOR FIELD-EFFECT TRANSISTORS

(71) Applicant: GLOBALFOUNDRIES Inc., Grand Cayman (KY)

(72) Inventors: Tao Han, Clifton Park, NY (US); Man Gu, Malta, NY (US); Jinping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/469,983

(22) Filed: Mar. 27, 2017

(51) Int. Cl.
| | |
|---|---|
| *H01L 23/58* | (2006.01) |
| *H01L 29/66* | (2006.01) |
| *H01L 21/28* | (2006.01) |
| *H01L 21/8234* | (2006.01) |
| *H01L 21/60* | (2006.01) |

(52) U.S. Cl.
CPC ........ *H01L 23/58* (2013.01); *H01L 21/28141* (2013.01); *H01L 21/823468* (2013.01); *H01L 29/6656* (2013.01); *H01L 29/66553* (2013.01); *H01L 29/66689* (2013.01); *H01L 29/66719* (2013.01); *H01L 2021/6009* (2013.01)

(58) Field of Classification Search
CPC ........... H01L 29/66553; H01L 29/6656; H01L 21/823864; H01L 29/7855–29/7856; H01L 2029/7858; H01L 23/58; H01L 21/28141
See application file for complete search history.

(56) References Cited

U.S. PATENT DOCUMENTS

| | | | |
|---|---|---|---|
| 6,869,893 B2 | 3/2005 | Reder et al. | |
| 8,859,430 B2 | 10/2014 | Chiba et al. | |
| 9,419,101 B1 | 8/2016 | Peng et al. | |
| 9,431,235 B1* | 8/2016 | Nguyen | ............ H01L 21/02126 |
| 2006/0220152 A1 | 10/2006 | Huang et al. | |
| 2008/0128766 A1 | 6/2008 | Huang et al. | |
| 2010/0078733 A1* | 4/2010 | Masuoka | ......... H01L 21/28088 257/384 |

OTHER PUBLICATIONS

Yi-Lung Cheng, et al., Comprehensive comparison of electrical and reliability characteristics of various copper barrier films, May 18, 2011, American Vacuum Society, J. Vac. Sci. Technol. B 29(3) May/Jun. 2011, 031207-1 to 031207-7.*

* cited by examiner

*Primary Examiner* — Tucker J Wright
(74) *Attorney, Agent, or Firm* — Thompson Hine LLP; Francois Pagette

(57) ABSTRACT

Structures for spacers in a device structure for a field-effect transistor and methods for forming spacers in a device structure for a field-effect transistor. First and second spacers are formed adjacent to a surface of a device component from respective conformal layers. The first spacer is positioned between the surface of the device component and the second spacer. The second spacer includes a plurality of first lamina and a plurality of second lamina that are arranged in an alternating sequence with the first lamina. The first spacer has a first dielectric constant, and the second spacer has a second dielectric constant that is greater than the first dielectric constant.

19 Claims, 1 Drawing Sheet

LAMINATED SPACERS FOR FIELD-EFFECT TRANSISTORS

BACKGROUND

The present invention relates to semiconductor device fabrication and integrated circuits and, more specifically, to structures for spacers in a device structure for a field-effect transistor and methods for forming spacers in a device structure for a field-effect transistor.

Device structures for a field-effect transistor include a source, a drain, a body situated between the source and drain, and a gate structure including a gate electrode and a gate dielectric separating the gate electrode from the body. A gate voltage applied to the gate electrode is used to provide switching that selectively connects the source and drain to each other through a channel formed in the body. The channel of a planar field-effect transistor is located beneath the top surface of the substrate on which the gate structure is supported. In contrast, the channel of a fin-type field-effect transistor is located in a semiconductor fin about which the gate electrode is wrapped.

Bi-layer spacers may be formed adjacent to the sidewalls of the gate electrode and, in many instances, may be characterized by material and/or physical properties intended to boost device performance. A bi-layer spacer typically includes an inner spacer of single thickness proximate to the sidewall of the gate electrode and an outer spacer of single thickness separated from the sidewall by the inner spacer. The inner spacer may be selected to have a lower dielectric constant than the outer spacer, which tends to boost device performance. The outer spacer may be selected to resist processes that cause material erosion and to thereby improve the robustness of the bi-layer spacer. For example, the etch rate of the outer spacer may be several times less than the etch rate of the inner spacer when exposed to the same etching, cleaning, or ashing processes. If the protection afforded by the outer spacer fails, the inner spacer can rapidly erode due to its higher etch rate. This erosion can lead to the formation of a void that links the gate electrode and an adjacent source/drain region, which is normally separated from the gate electrode by the bi-layer spacer.

Improved structures for spacers in a device structure for a field-effect transistor and methods for forming spacers in a device structure for a field-effect transistor are needed.

SUMMARY

In an embodiment of the invention, a structure includes first and second spacers adjacent to a surface of a device component. The first spacer is positioned between the surface of the device component and the second spacer. The second spacer includes a plurality of first lamina and a plurality of second lamina that are arranged in an alternating sequence with the first lamina. The first spacer has a first dielectric constant, and the second spacer has a second dielectric constant that is greater than the first dielectric constant.

In an embodiment of the invention, a method includes forming a device component, forming a first conformal layer adjacent to a surface of the device component, and forming a plurality of first lamina and a plurality of second lamina that are arranged in an alternating sequence with the first lamina as a second conformal layer separated from the surface of the device component by the first conformal layer. A first spacer is formed from the first conformal layer, and a second spacer is formed from the second conformal layer. The first spacer has a first dielectric constant, and the second spacer has a second dielectric constant that is greater than the first dielectric constant.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
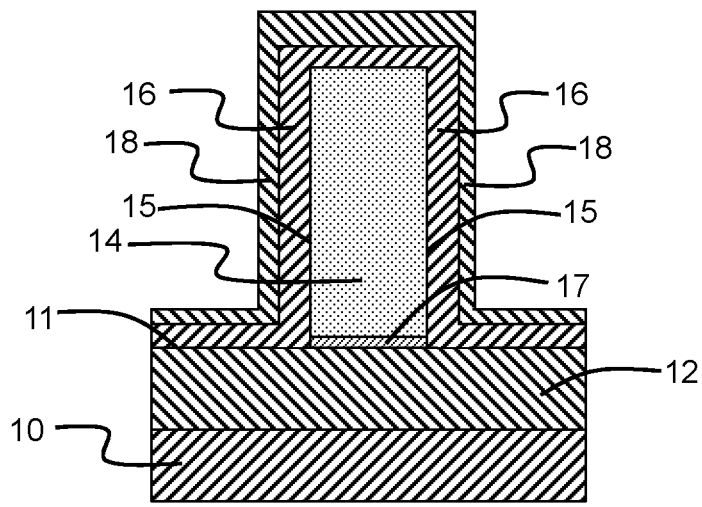
FIG. 1 is a cross-sectional view of a device structure at an initial stage of a processing method in accordance with embodiments of the invention.
Figure 1A:
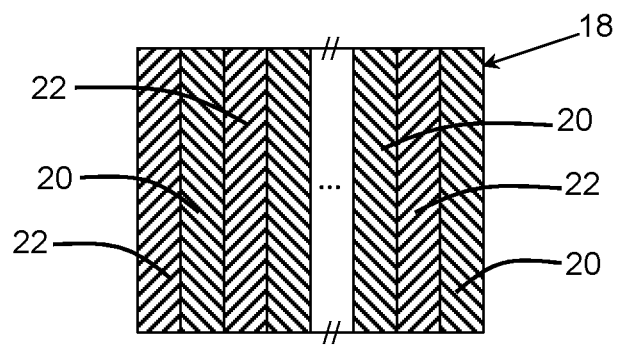
FIG. 1A is an expanded view of the laminated conformal layer of FIG. 1 that is used to fabricate the laminated spacer of FIG. 2.

With reference to FIGS. 1, 1A and in accordance with embodiments of the invention, a fin 10 comprised of a semiconductor material projects vertically from a substrate 12. The fin 10 may be formed from an epitaxial layer of intrinsic semiconductor material at the top surface of the substrate 12 and patterned using photolithography and etching processes, such as a sidewall imaging transfer (SIT) process or self-aligned double patterning (SADP). The substrate 12 may be a bulk substrate or a device layer of a semiconductor-on-insulator (SOI) substrate. The fin 10 may be used to fabricate a fin-type field-effect transistor (FinFET) that further includes a gate electrode 14 arranged to overlap with a central region of the fin 10. A gate dielectric 17, which is electrically insulating, is disposed between the gate electrode 14 and the fin 10 so that the gate electrode 14 has indirect contact with the exterior surfaces of the fin 10. The gate electrode 14 and gate dielectric 17 represent device components of the FinFET, which may also include, for example, source/drain regions as additional device components.

The gate electrode 14 may be composed of a semiconductor material, such as polysilicon, deposited by chemical vapor deposition (CVD). Alternatively, the gate electrode 14 may be composed of one or more metals, such as titanium aluminum carbide (TiAlC), titanium nitride (TiN), tungsten (W), or a layered combination, deposited by physical vapor deposition (PVD), atomic layer deposition (ALD), CVD, or another deposition process. The gate dielectric 17 may be composed of a dielectric material, such as silicon dioxide ($SiO_2$), deposited by CVD. Alternatively, the gate dielectric 17 may be composed of a high-k dielectric material, such as hafnium oxide or hafnium oxynitride, deposited by CVD, ALD, or another deposition process. In a replacement metal gate process, a polysilicon gate electrode may be removed and replaced by a metal gate electrode in conjunction with spacer formation as subsequently described herein.

In an alternative embodiment, the gate electrode 14 may be a device component of a planar field-effect transistor instead of a FinFET. The fin 10 is omitted, and the gate electrode 14 of the planar field-effect transistor may be formed on and project from the top surface of the substrate 12. The gate electrode 14 is separated from the top surface of the substrate 12 by the gate dielectric 17.

A conformal layer 16 is deposited that covers the gate electrode 14, including its vertical sidewalls 15, and the fin 10, including its top surface 11. A conformal layer 18 is deposited that covers the conformal layer 16 on the gate electrode 14 and the fin 10. The inner conformal layer 16 is arranged between the vertical sidewalls 15 of the gate electrode 14 and the outer conformal layer 18. The conformal layers 16, 18 may be formed by ALD in which the deposition of each atomic layer of spacer material, or a fraction thereof, is controlled by alternating and sequential introduction of appropriate gas phase reactants that combine in a self-limiting manner to incrementally form or build the conformal layers 16, 18. The conformal layers 16, 18 conform to the non-planar topography arising from the gate electrode 14 and the deposited films have a thickness that is constant regardless of the feature geometry of the underlying gate electrode 14 and fin 10. The thicknesses of the conformal layers 16, 18 may be measured, for example, in a horizontal direction with reference to a plane including one of the sidewalls 15 of the gate electrode 14.

The conformal layer 16 may be composed of a thin film of a dielectric material, such as silicon oxycarbonitride (SiOCN), in which the composition is engineered (i.e., tailored) to provide a specific value for the dielectric constant (i.e., permittivity or k). The conformal layer 16 is not laminated (i.e., is non-laminated or lacks laminations), as is the spacer that is subsequently formed from the conformal layer 16. The conformal layer 16 is not composed of multiple layers or lamina, but is instead composed of a single layer.

As best shown in FIG. 1A, the conformal layer 18 may be composed of a plurality of lamina 20 and a plurality of lamina 22 that repeat in an alternating pattern or sequence that repeats in pairs or periods across the thickness of the conformal layer 18. The lamina 20 and the lamina 22 interchange repeatedly and regularly with one another in place over the thickness of the conformal layer 18. This contrasts with the conformal layer 16 that has a single thickness.

The lamina 20 are composed of a dielectric material, and the lamina 22 are also composed of a dielectric material. However, the lamina 20 are composed of a different dielectric material than the lamina 22. In an embodiment, the dielectric material forming the lamina 20 and/or the lamina 22 contains oxygen in its composition. In an embodiment, the dielectric material of which the lamina 20 are composed may be silicon oxycarbonitride (SiOCN), and the dielectric material of which the lamina 22 are composed may be silicon carbonitride (SiCN). The composition of the lamina 20 and the lamina 22 may be engineered (i.e., tailored) to provide a specific value for the dielectric constant (i.e., permittivity or k) of the conformal layer 18. The conformal layer 18 may have a dielectric constant that is greater than the dielectric constant of the conformal layer 16.

The total thickness of the conformal layer 18 may be less than the thickness of the conformal layer 16. The total thickness of the conformal layer 18 is equal to the sum of the thicknesses of the periods or pairs of lamina 20 and lamina 22 that are deposited. Each individual lamina 20 has a thickness that is a fraction of the total thickness of the conformal layer 18. Similarly, each individual lamina 22 has a thickness that is a fraction of the total thickness of the conformal layer 18. For example, the conformal layer 18 may have a thickness of 2 nanometers, each lamina 20 may have a thickness of around 0.1 nanometers, and each lamina 22 may have a thickness of around 0.15 nanometers. In an embodiment, the conformal layer 16 may have a thickness that is greater than or equal to four (4) nanometers, the conformal layer 18 may have a thickness that less than or equal to two (2) nanometers, and the lamina 20, 22 may have thicknesses that are less than or equal to 0.2 nanometers. The thickness of the conformal layer 16 is numerically over an order of magnitude greater than the thickness of each lamina 20 and also over an order of magnitude greater than the thickness of each lamina 22.

The lamina 20 of the conformal layer 18 and the lamina 22 of the conformal layer 18 may be formed by an ALD process using a multiple-step sequence in which gas phase reactants are cyclically introduced in a specific order and with specific deposition conditions into a reaction chamber. The reaction chamber is coupled with gas sources supplying the gas phase reactants, a purge gas source of an inert gas (e.g., argon (Ar) or nitrogen ($N_2$)), and a vacuum source. Prior to initiating the cyclic deposition process, the reaction chamber may be initially evacuated and/or purged, and the substrate 12 may be heated to a given process temperature, such as a temperature in a range of 550° C. to 680° C.

In an initial step of an exemplary cyclic ALD process to form silicon oxycarbonitride (SiOCN) as one of the lamina 20, the gas phase reactant introduced into the reaction chamber is a silicon-containing precursor, such as the inorganic compound hexachlorodisilane ($Si_2Cl_6$). The silicon-containing precursor is flowed for a given flow time and at a given flow rate, and permitted to adsorb on the exterior surface of the gate electrode 14.

After the reaction chamber is evacuated and purged to clear the silicon-containing precursor from the reaction chamber, a subsequent step of the cyclic ALD process may be performed in which the gas phase reactant introduced into the reaction chamber is a carbon-containing precursor, such as methyl ethylene ($C_3H_6$). The carbon-containing precursor is flowed for a given flow time and at a given flow rate, and permitted to adsorb on the exterior surface of the gate electrode 14 and combine with the adsorbed silicon.

After the reaction chamber is evacuated and purged to clear the carbon-containing precursor from the reaction chamber, a subsequent step of the cyclic ALD process may be performed in which the gas phase reactant introduced into the reaction chamber is an oxygen-containing precursor, such as oxygen ($O_2$). The oxygen-containing precursor is flowed for a given flow time and at a given flow rate, and permitted to adsorb on the exterior surface of the gate electrode 14 and combine with the adsorbed silicon.

After the reaction chamber is evacuated and purged to clear the oxygen-containing precursor from the reaction chamber, a subsequent step of the cyclic ALD process may be performed in which the gas phase reactant introduced into the reaction chamber is a nitrogen-containing precursor, such as nitrogen ($N_2$). The nitrogen-containing precursor is flowed for a given flow time and at a given flow rate, and permitted to adsorb on the exterior surface of the gate electrode 14 and combine with the adsorbed silicon.

After lamina 20 is formed, the reaction chamber is evacuated and purged to clear the nitrogen-containing precursor from the reaction chamber. In a subsequent step of the cyclic ALD process to form silicon carbonitride (SiCN) as one of the lamina 22, the process proceeds as described above for lamina 20 with the exception of skipping the introduction of the oxygen-containing precursor. The cyclic ALD process is repeated to deposit additional pairs of the lamina 20 and the lamina 22 in order to build the total thickness of the conformal layer 18. The number of lamina 20 and the number of lamina 22, when summed, is equal to the thickness of the conformal layer 18.

Figure 2:
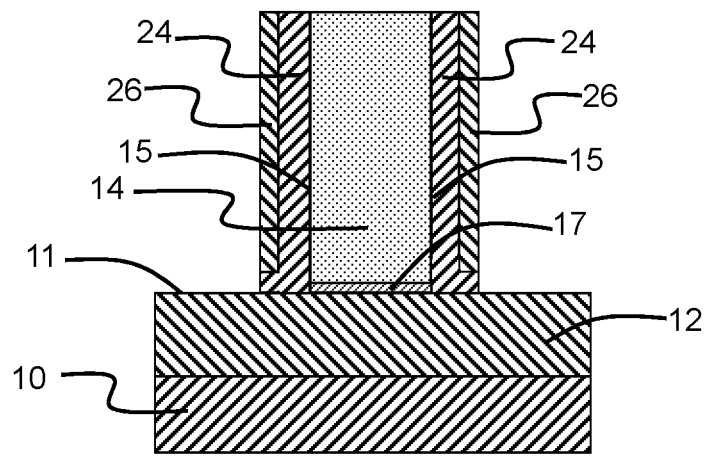
FIG. 2 is a cross-sectional view of the device structure of FIG. 1 at a subsequent stage of the processing method.

With reference to FIG. 2 in which like reference numerals refer to like features in FIGS. 1, 1A and at a subsequent fabrication stage, spacers 24, 26 are formed from the conformal layers 16, 18 by shaping the conformal layers 16, 18 with an etching process, such as reactive ion etching (RIE), that preferentially removes the dielectric material from horizontal surfaces, such as the top surface 11 of the fin 10 and the top surface of the gate electrode 14. The etch chemistry(ies) for the etching process removes the conformal layers 16, 18 from the horizontal surfaces selective to the materials constituting the fin 10 and gate electrode 14. As used herein, the term "selective" in reference to a material removal process (e.g., etching) denotes that, with an appropriate etchant choice, the material removal rate (i.e., etch rate) for the targeted material is greater than the removal rate for at least another material exposed to the material removal process.

The inner spacers 24 represent the sections of the conformal layer 16 positioned adjacent to the vertical sidewalls 15 of the gate electrode 14. The outer spacers 26 represent the sections of the conformal layer 18 positioned adjacent to the vertical sidewalls 15 of the gate electrode 14. The outer spacers 26 may cover the exterior surfaces of the inner spacers 24 in their entirety with the inner spacers 24 laterally arranged between the outer spacers 26 and the vertical sidewalls 15 of the gate electrode 14. The inner spacers 24, which have a lower dielectric constant than the outer spacers 26, may improve device performance by lower capacitance, while the outer spacers 26 protect the more fragile inner spacers 24 against erosion during cleans, ashings, and etches performed during device fabrication subsequent to deposition.

The outer spacers 26 will inherit the laminated construction of the conformal layer 18, and the inner spacers 24 will inherit the non-laminated construction of the conformal layer 16. After etching, the thickness of the inner spacers 24 may be equal to the as-deposited thickness of the conformal layer 16, and the thickness of the outer spacers 26 may be equal to the as-deposited thickness of the conformal layer 18. In particular, each of the outer spacers 26 includes the lamina 20 and lamina 22 (FIG. 1A) that repeat in an alternating pattern or sequence of pairs or periods across the thickness of the spacer 26. The collective thicknesses of all of the repeating pairs of lamina 20 and lamina 22 contribute to the total thickness of the outer spacers 26. In an embodiment, the outer spacers 26 may have a thickness that is less than or equal to two nanometers, which is less than the thickness of conventional outer spacers that lack the laminated construction of the outer spacers 26.

The as-deposited thickness of the outer spacers 26 may be reduced to a thinner final thickness following erosion from the various cleans, ashings, and etches performed as subsequent processing during device fabrication. The reduction in thickness may result from oxidation of the lamina 20, 22. In an embodiment, the final thickness of the outer spacers 26 may include three or more of the lamina 20 and three or more of the lamina 22 to provide a thickness that is sufficient to operate as a protective layer or crust for the inner spacers 24. The thickness of the outer spacers 26, after the subsequent processes, may be less than the thickness of conventional outer spacers that lack the laminated construction of the outer spacers 26, which lead to an effective widening of the space between adjacent gate electrodes in a device structure. As a result, the outer spacers 26 may have a lower effective dielectric constant than conventional outer spacers that lack the laminated construction of the outer spacers 26.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a device component having a surface;
a first spacer adjacent to the surface of the device component; and
a second spacer adjacent to the surface of the device component,
wherein the first spacer is positioned between the surface of the device component and the second spacer, the first spacer has a first dielectric constant, the second spacer has a second dielectric constant that is greater than the first dielectric constant, the second spacer includes a plurality of first lamina and a plurality of second lamina that are arranged in an alternating sequence with the first lamina, the first spacer has a first thickness, each of the first lamina has a second thickness, each of the second lamina has a third thickness, and the first thickness is at least an order of magnitude greater than either the second thickness or the third thickness.

2. The structure of claim 1 wherein the first spacer is non-laminated.

3. The structure of claim 1 wherein the first lamina are composed of a dielectric material that contains oxygen.

4. The structure of claim 1 the second spacer has a fourth thickness that is less than the first thickness.

5. The structure of claim 1 wherein the device component is a gate electrode of a field-effect transistor.

6. The structure of claim 5 further comprising:
a semiconductor fin projecting vertically from a substrate,
wherein the gate electrode overlaps with the semiconductor fin, and the surface is a vertical sidewall of the gate electrode.

7. The structure of claim 1 wherein the first thickness of the first spacer is greater than or equal to four nanometers, the second spacer has a fourth thickness less than or equal to two nanometers, the second thickness of each of the first lamina is less than or equal to 0.2 nanometers, and the third thickness of each of the second lamina is less than or equal to 0.2 nanometers.

8. The structure of claim 1 wherein the first lamina are composed of silicon oxycarbonitride, and the second lamina are composed of silicon carbonitride.

9. A structure comprising:
a device component having a surface;
a first spacer adjacent to the surface of the device component; and
a second spacer adjacent to the surface of the device component,
wherein the first spacer is positioned between the surface of the device component and the second spacer, the first spacer has a first dielectric constant, the second spacer has a second dielectric constant that is greater than the first dielectric constant, the second spacer includes a plurality of first lamina and a plurality of second lamina that are arranged in an alternating sequence with the first lamina, the first lamina are composed of silicon oxycarbonitride, and the second lamina are composed of silicon carbonitride.

10. A method comprising:
forming a device component;
forming a first conformal layer adjacent to a surface of the device component;
forming a plurality of first lamina and a plurality of second lamina that are arranged in an alternating sequence with the first lamina to define a second conformal layer separated from the surface of the device component by the first conformal layer;
forming a first spacer from the first conformal layer; and
forming a second spacer from the second conformal layer,
wherein the first spacer has a first dielectric constant, the second spacer has a second dielectric constant that is greater than the first dielectric constant, the first spacer has a first thickness, each of the first lamina has a second thickness, each of the second lamina has a third thickness, and the first thickness is at least an order of magnitude greater than either the second thickness or the third thickness.

11. The method of claim 10 wherein forming the plurality of first lamina and the plurality of second lamina comprises:
performing a first atomic layer deposition process and a second atomic layer deposition process in an alternating sequence to form the first lamina and the second lamina.

12. The method of claim 10 wherein the device component is a gate electrode of a field-effect transistor, and the gate electrode overlaps with a semiconductor fin projecting vertically from a substrate.

13. The method of claim 10 wherein the device component is a gate electrode of a field-effect transistor, and the surface is a vertical sidewall of the gate electrode.

14. The method of claim 10 wherein the first spacer is non-laminated.

15. The method of claim 10 wherein the first lamina are composed of a dielectric material that contains oxygen.

16. The method of claim 10 wherein the second spacer has a fourth thickness that is less than the first thickness.

17. The method of claim 10 wherein the first lamina are composed of silicon oxycarbonitride, and the second lamina are composed of silicon carbonitride.

18. The method of claim 10 further comprising: after the second spacer is formed, eroding the second spacer with subsequent processing, wherein the eroded second spacer includes three or more of the first lamina and three or more of the second lamina.

19. The method of claim 10 wherein the first thickness of the first spacer is greater than or equal to four nanometers, the second spacer has a thickness less than or equal to two nanometers, the second thickness of each of the first lamina is less than or equal to 0.2 nanometers, and the third thickness of each of the second lamina is less than or equal to 0.2 nanometers.

* * * * *

UNITED STATES PATENT AND TRADEMARK OFFICE
CERTIFICATE OF CORRECTION

PATENT NO. : 10,008,456 B1
APPLICATION NO. : 15/469983
DATED : June 26, 2018
INVENTOR(S) : Tao Han et al.

Page 1 of 1

It is certified that error appears in the above-identified patent and that said Letters Patent is hereby corrected as shown below:

In the Claims

At Column 7, Claim number 4, Line number 3, after "1" insert --wherein--

Signed and Sealed this
Twenty-eighth Day of May, 2019

Andrei Iancu
*Director of the United States Patent and Trademark Office*